United States Patent [19]

Gernitis et al.

[11] 4,025,997

[45] May 31, 1977

[54] CERAMIC MOUNTING AND HEAT SINK DEVICE

[75] Inventors: Jeffrey Gernitis, Oak Ridge; Bruno Butti, Englewood Cliffs, both of N.J.

[73] Assignee: International Telephone & Telegraph Corporation, Nutley, N.J.

[22] Filed: Dec. 23, 1975

[21] Appl. No.: 643,740

[52] U.S. Cl. .............................. 428/621; 357/81; 428/663

[51] Int. Cl.² ........................................ B32B 15/04

[58] Field of Search ............... 29/195 M, 198, 199; 357/81

[56] References Cited

UNITED STATES PATENTS

| | | | |
|---|---|---|---|
| 2,697,130 | 12/1954 | Korbelak | 29/198 X |
| 2,993,271 | 7/1961 | Crapuchettes | 29/198 X |
| 3,147,547 | 9/1964 | Kuebrich et al. | 29/198 X |
| 3,620,692 | 11/1971 | Franklin et al. | 29/195 |
| 3,780,795 | 12/1973 | Arnold | 357/81 X |

Primary Examiner—L. Dewayne Rutledge
Assistant Examiner—E. L. Weise
Attorney, Agent, or Firm—John T. O'Halloran; Peter C. Van Der Sluys; Vincent B. Ingrassia

[57] ABSTRACT

This relates to a multi-layer composite metallic sheet having a predetermined coefficient of thermal expansion for use as a heat sink and mounting arrangement when bonded to a ceramic substrate. Since copper has a coefficient of thermal expansion greater than that of ceramic and molybdenum has a coefficient of thermal expansion less than that of ceramic, layers of copper and molybdenum can be combined to provide a composite having a coefficient of thermal expansion equal to that of ceramic. To avoid a bimetallic effect, a core layer of a fused metal is sandwiched between two outer layers of the second metal.

13 Claims, 5 Drawing Figures

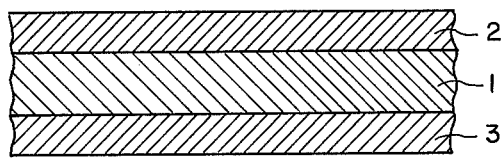
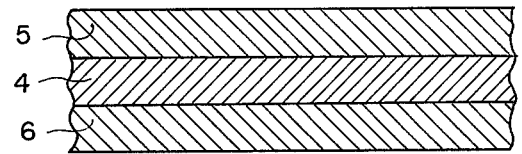
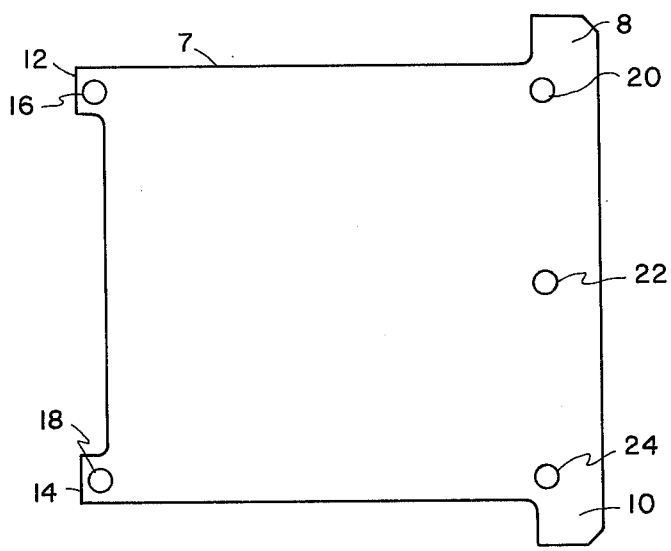
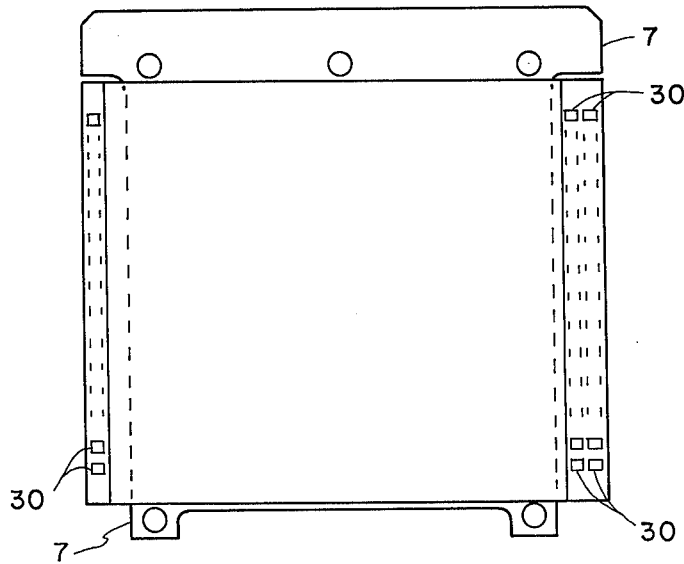
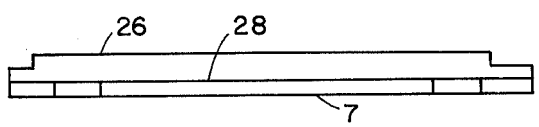

CERAMIC MOUNTING AND HEAT SINK DEVICE

BACKGROUND OF THE INVENTION

This invention relates to heat sinks and, more particularly, to a multilayer composite metallic sheet having a predetermined coefficient of thermal expansion for use as a heat sink and mounting arrangement for high power ceramic thick film hybrid packages.

It has been necessary in the past to bond metallic heat sinks to ceramic substrates. Clearly, to avoid the problem of fracturing during subsequent thermal processing, it has been necessary to match the coefficient of thermal expansion of the ceramic substrate with that of the metallic heat sink which is bonded thereto. A substance known as Kovar has been developed which has expansion characteristics similar to those of glass and has been used as a heat sink material for ceramic substrates. However, the ceramic substrates have generally been rather small (in the order of 1 × 1) and therefore, the poor heat dissipating characterisitics of Kovar did not represent a major problem since the small ceramic hybrids were low power devices and therefore did not generate a large amount of heat. The trend towards large scale integration (LSI) wherein entire micro-processors are placed on a single ceramic substrate has made it necessary to resort to larger ceramic packages. Therefore, it is necessary that the heat sink, which is bonded to the package, has a coefficient of thermal expansion which substantially matches that of the ceramic to avoid fracturing and superior heat dissipating properties in order to accommodate the higher power hybrid. Kovar has been proved to be unsuitable for the larger, higher power devices.

SUMMARY OF THE INVENTION

It is an object of the present invention to provide a multilayer composite metallic sheet, wherein the composite has a predetermined coefficient of thermal expansion.

It is a further object of the present invention to provide a heat sink and mounting arrangement for high power ceramic thick film hybrid packages.

It is a further object of the present invention that the heat sink and mounting arrangement have thermal expansion characteristics which substantially match that of the thick film ceramic substrate.

It is a further object of the invention that the heat sink and mounting arrangement have good heat dissipating properties (high thermal conductivity) in order to accommodate higher power devices.

According to a broad aspect of the invention, there is provided a heat sink comprising: a first layer of a first material having a first coefficient of thermal expansion; and second and third layers of a second material each bonded to an outer opposite surface of said first layer, said second material having a second coefficient of thermal expansion.

According to a further aspect of the invention, there is provided a tri-layer composite metallic sheet for use as a heat sink for a fracturable material having a predetermined coefficient of thermal expansion comprising: a first layer of a first material having a first coefficient of thermal expansion; and second and third layers of a second material each bonded to opposite surfaces of said first layer, said second material having a second predetermined coefficient of thermal expansion wherein the coefficient of thermal expansion of said fracturable material is intermediate the coeffients of thermal expansion of said first and second materials and wherein the thickness of said first layer $X_1$ and the total thickness of said second and third layers $X_2$ are governed by the equation $$\frac{X_1}{X_2} = \left(\frac{\alpha_2 - \alpha_3}{\alpha_1 - \alpha_3}\right)\frac{E_2}{E_1}$$

where $\alpha_3$ is the coefficient of thermal expansion of said fracturable material, $\alpha_1$ is the coefficient of thermal expansion of said first material, $\alpha_2$ is the coefficient of expansion of said second material, $E_1$ is the modulus of elasticity of said first material and $E_2$ is the modulus of elasticity of said second material.

The above and other objects of the present invention will be more clearly understood from the following detailed description taken in conjuction with the accompanying drawings in which:

BRIEF DESCRIPTION OF THE DRAWINGS

FIG. 1a is a sectional view of one embodiment of a tri-layer composite sheet employing copper and molybdenum;

FIG. 1b is a sectional view of a second embodiment of a tri-layer composite sheet employing copper and molybdenum.

FIG. 2 is a plan view of a heat sink and mounting arrangement in accordance with the invention;

FIG. 3a is a plan view of a ceramic substrate bonded to the heat sink of FIG. 2; and FIG. 3b is a side view of a ceramic substrate bonded to the heat sink of FIG. 2.

DESCRIPTION OF THE PREFERRED EMBODIMENT

It has been discovered that by bonding dissimilar metals together, the physical properties of the composite structure can be controlled; for example, bonding a metal which has a high coefficient of thermal expansion to a metal which has a low coefficient of thermal expansion will result in a composite structure which exhibits thermal expansion characteristics intermediate the characteristics of either of the metals as they exist independently. In a situation where a sheet of metal must be bonded to a ceramic substrate to provide support for the substrate and good heat dissipation, it is clearly necessary that the metal sheet have thermal expansion characteristics which match that of the substrate. By simply bonding two metals having different expansion characteristics together, it is clear that a bimetallic structure will result, causing stresses on the substrate. However, as will be explained in detail hereinbelow, a tri-level structure can be manufactured using appropriately selected metals wherein the thicknesses of each layer are related to in some predetermined proportion such that only shearing stresses will occur between the layers, thereby eliminating the bimetallic effect.

If, for example, a composite of copper and molybdenum is employed wherein the thicknesses of both the copper and molybdenum are related to each other in a proper portion, the coefficient of thermal expansion of the composite may be matched to the ceramic.

Table I illustrates the values of the coefficient of thermal expansion, modulus of elasticity and thermal conductivity of copper, molybdenum and ceramics.

TABLE I

| Material | Coefficient of Thermal Expansion $\alpha$ (In/In° C) | Modulus of Elasticity E (lbs/in²) | Thermal Conductivity K (BTU-ft/ (hr.ft.² ° F) |
|---|---|---|---|
| Copper | $17.6 \times 10^{-6}$ | $17 \times 10^6$ | 226 |
| Molybdenum | $4.9 \times 10^{-6}$ | $47 \times 10^6$ | 84.5 |
| Ceramic | $6.4 \times 10^{-6}$ | $47 \times 10^6$ | 20 |

It can be seen that copper has a coefficient of thermal expansion which is substantially higher than that of ceramic, whereas molybdenum has a coefficient of thermal expansion smaller than that of ceramic. It should be also noted that both copper and molybdenum have a thermal conductivity higher than that of ceramic, with that of the copper being substantially higher than that of the molybdenum.

When two metals having different coefficients of thermal expansion are heated, a bimatallic effect will result since the overall expansion of the metal possessing the higher coefficient of thermal expansion will be greater than the thermal expansion of metal having the lower coefficient of thermal expansion. To compensate for the different expansions, the first metal must be deflected (compressed) to reduce its thermal expansion and/or the second metal must be deflected (expanded) to increase its thermal expansion.

The formula for determining material deflection as a result of an externally applied force is shown in equation (1)

$$\delta = (Pl/AE) \tag{1}$$

where $\delta$ is the deflection, $P$ is force, $l$ is length, $A$ is the cross sectional area (thickness × width), and $E$ is the modulus of elasticity. The formula for thermal expansion is given in equation (2).

$$\Delta l = l \alpha \Delta t \tag{2}$$

where $l$ is length, $\alpha$ is the coefficient of thermal expansion, $\Delta t$ represents the change in temperature and $\Delta l$ represents the thermal expansion due to the change in temperature.

Since the coefficient of thermal expansion of copper is greater than that of the ceramic, the thermal expansion of the copper must be restrained so as not to fracture the ceramic if copper is to be bonded to ceramic for heat dissipation and mounting purposes. Therefore, a force must be exerted on the copper to limit its expansion to that of the ceramic. Equation (3) illustrates the situation in equation form.

$$(\alpha \text{copper} - \alpha \text{ceramic}) \, l \Delta t = (P \text{copper} \cdot l)/A E \text{copper} \tag{3}$$

By substituting in the appropriate values from Table I, equation (4) can be realized which represents the force necessary to control the expansion of copper wherein $X_{cu}$ represents the thickness of the copper having a unit width.

$$P \text{copper} = 11.2 \times 10^{-6} \, (17 \times 10^6) \, X_{cu} \Delta t \tag{4}$$

In a like manner, the force necessary to enhance the thermal expansion of molybdenum may be determined. This is shown in equation (5)

$$P \text{molybdenum} = 1.5 \times 10^{-6} \, (47 \times 10^6) \, X_{mo} \Delta t \tag{5}$$

Since we are dealing with a composite body, the force necessary to restrain the thermal expansion of the copper must equal the force necessary to enhance the thermal expansion of the molybdenum. Therefore, setting these two quantities equal to each other, the ratio of the thickness of copper to the thickness of molybdenum can be computed, the result being shown in equation (6).

$$(X_{cu}/X_{mo}) = 0.3703 \tag{6}$$

This ratio must be maintained in order that the composite have an overall coefficient of thermal expansion equal to that of the ceramic.

If we assume a total composite thickness of 0.062, then in accordance with the above ratio, the thickness of the molybdenum must be 0.046 and the thickness of copper must be 0.016.

To avoid any bimetallic effect, the core material (molybdenum) is sandwiched between two layers of the outer material (copper), the two layers being of equal thickness. This is shown in FIG. 1a wherein a layer 1 of molybdenum having a thickness of 0.046 is sandwiched between two layers 2 and 3 of copper, each having a thickness of 0.008, resulting in a composite having a total thickness of 0.062.

In the alternative, the copper may be sandwiched between two layers of molybdenum as shown in FIG. 1b. In this case, the 0.016 inch copper core 4 is sandwiched between two outer layers 5 and 6 of molybdenum each having a thickness of 0.023 inch.

As can be seen, the composite is structured such that only shear stresses are produced yielding no bending. The composites may be fabricated by a number of known techniques, such as welding, cladding, plating, etc.

The alumina (ceramic) substrate may be attached to the composite heat sink by soldering the sink to a metalization layer on the substrate. The resulting hybrid package is a compact module with extremely high heat dissipating properites heretofore unattainable.

It should be clear that the above techniques can be applied to any situation where thermal cycling produces undesired bending effects and wherein two materials are coupled together and one of the materials cannot be stressed to absorb the bimetallic effect. It should also be clear that the discussion of copper and molybdenum is given by way of example only. Other metals may be used to match the characteristics of ceramic or other easily fracturable substances.

FIG. 2 shows a preferred form of the heat sink and mounting arrangement 7 made of the above described composite. Extremities 8, 10, 12 and 14 are employed for mounting and alignment purposes. The structure also contains apertures 16, 18, 20, 22 and 24 for mounting on a printed circuit board.

FIGS. 3a and b show in a plan view and side view respectively the heat sink and mounting device 7 having mounted thereon and bonded thereto, for example by soldering to a metalization layer 28, a ceramic substrate 26. Contact pads 30 are provided for external connections.

What is claimed is:

1. An apparatus for mounting and dissipating heat from a fracturable substrate coupled thereto, said substrate having a first coefficient of thermal expansion comprising:
    a first layer of a first material having a second coefficient of thermal expansion; and
    second and third layers of a second material each bonded to an outer opposite surface of said first layer, said second material having a third coefficient of thermal expansion, said first coefficient of thermal expansion intermediate that of said second and third coefficients of thermal expansion.

2. An apparatus according to claim 1 wherein said fracturable material is a ceramic.

3. An apparatus according to claim 2 wherein said first material is copper and said second material is molybdenum.

4. An apparatus according to claim 2 wherein said first material is molybdenum and said second material is copper.

5. An apparatus according to claim 2 wherein said second and third layers are of equal thickness.

6. An apparatus according to claim 5 wherein said heat sink is mounted on a printed circuit board.

7. An apparatus according to claim 6 wherein the resultant coefficient of thermal expansion of said heat sink is substantially equal to that of said ceramic substrate.

8. An apparatus according to claim 3 wherein said first layer has a thickness of 0.016 and said second and third layers each have a thickness of 0.023.

9. An apparatus according to claim 4 wherein said first layer has a thickness of 0.046 and said second and third layers each have a thickness of 0.008.

10. A tri-layer composite metallic sheet for use as a heat sink for a fracturable material having a predetermined coefficient of thermal expansion comprising:
    a first layer of a first material having a first coefficient of thermal expansion; and
    second and third layers of a second material each bonded to opposite surfaces of said first layer, said second material having a second predetermined coefficient of thermal expansion wherein the coefficient of thermal expansion of said fracturable material is intermediate the coefficients of thermal expansion of said first and second materials and wherein the thickness of said first layer $X_1$ and the total thickness of said second and third layers $X_2$ are governed by the equation $$\frac{X_1}{X_2} = \left(\frac{\alpha_2 - \alpha_3}{\alpha_1 - \alpha_3}\right)\left(\frac{E_2}{E_1}\right)$$

where $\alpha_3$ is the coefficient of thermal expansion of said fracturable material, $\alpha_1$ is the coefficient of thermal expansion of said first material, $\alpha_2$ is the coefficient expansion of said second material, $E_1$ is the modulus of elasticity of said first material and $E_2$ is the modulus of elasticity of said second material.

11. A tri-layer composite metallic sheet according to claim 10 wherein said fracturable material is ceramic, said first material is copper, and said second material is molybdenum.

12. A tri-layer composite metallic sheet according to claim 10 wherein said second and third layers are of equal thickness.

13. A tri-layer composite metallic sheet according to claim 10 wherein said heat sink is fixedly coupled to said substrate.

* * * * *